(12) United States Patent
Shimizu

(10) Patent No.: US 8,005,122 B2
(45) Date of Patent: Aug. 23, 2011

(54) MODE-LOCKED LASER

(75) Inventor: Takanori Shimizu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/739,851

(22) PCT Filed: Oct. 27, 2008

(86) PCT No.: PCT/JP2008/069444
§ 371 (c)(1),
(2), (4) Date: Apr. 26, 2010

(87) PCT Pub. No.: WO2009/054526
PCT Pub. Date: Apr. 30, 2009

(65) Prior Publication Data
US 2010/0246612 A1 Sep. 30, 2010

(30) Foreign Application Priority Data
Oct. 25, 2007 (JP) .................................. 2007-277439

(51) Int. Cl.
*H01S 3/098* (2006.01)
*H01S 3/083* (2006.01)
(52) U.S. Cl. .......................................... 372/18; 372/94
(58) Field of Classification Search .................... 372/11, 372/18, 19, 94
See application file for complete search history.

(56) References Cited

FOREIGN PATENT DOCUMENTS

| JP | H11-298072 A | 10/1999 |
|---|---|---|
| JP | 2003-031897 A | 1/2003 |
| JP | 2005-327881 A | 11/2005 |
| JP | 2006-278770 A | 10/2006 |
| WO | 2005/096462 A | 10/2005 |

OTHER PUBLICATIONS

International Search Report for PCT/JP2008/069444, mailed Nov. 18, 2008.
S. Matsuo et al.,"Widely Tunable Laser Using Microring Resonator", Semiconductor Laser Conference Digest, IEEE 20th International, 2006, pp. 21-22.
M. Takahashi et al., "Tunable Laser Based on Silica Waveguide Ring Resonator", 2007 Optical Fiber Communication and the National Fiber Optic Engineers Conference, OFC/NFOEC, Mar. 25, 2007, p. 1-3.
M. Takahashi et al., "A Stable Widely Tunable Laser Using a Silica-Waveguide Triple-Ring Resonator", 2005 Optical Fiber Communication Conference Technical Digest, OFC/NFOEC, No. 6, vol. 5, Mar. 6, 2005, p. 3.

*Primary Examiner* — Armando Rodriguez

(57) ABSTRACT

A mode-locked laser includes a two-electrode semiconductor laser (3) including a saturable absorber section (31) and gain section (32), and an optical waveguide (4) formed outside the gain section (32) of the two-electrode semiconductor laser. The optical waveguide (4) includes a ring resonator (43) having a resonator length which is an integral fraction of the total resonator length of the mode-locked laser, another ring resonator (44) having bandpass filter characteristics whose bandwidth is narrower than a gain bandwidth, and a reflective surface (46) which reflects, toward the two-electrode semiconductor laser (3), a laser beam having arrived from the two-electrode semiconductor laser (3) via the first and second ring resonators.

9 Claims, 7 Drawing Sheets

WHEN THERE IS NO RING RESONATOR 43

WHEN THERE IS RING RESONATOR 43

MODE-LOCKED LASER

This application is the National Phase of PCT/JP2008/069444, filed on Oct. 27, 2008, which is based upon and claims the benefit of priority from Japanese Patent Application No. 277439/2007, filed on Oct. 25, 2007.

TECHNICAL FIELD

The present invention relates to a semiconductor laser and, more particularly, to a mode-locked semiconductor laser technique of generating an optical pulse train having a high repetition frequency.

BACKGROUND ART

Recently, optical communication represented by, e.g., an inter-city network or intercontinental/intracontinental backbone network or an optical interconnection applied to, e.g., a server/router requires an optical pulse train having a high repetition frequency as the communication speed or the capacity increases. An example of an apparatus for generating this optical pulse train is an apparatus using a fiber ring mode-locked laser or mode-locked semiconductor laser.

In a conventionally proposed fiber ring mode-locked laser, a filter region having a ring resonator or two optical waveguide grating routers is formed inside or outside a fiber ring, and a desired high-order longitudinal mode is selectively transmitted (see, e.g., Japanese Patent Laid-Open No. 11-298072, pp. 3-6, FIGS. 2, 3, 10, and 11).

Also, in a conventionally proposed optical clock pulse train generator based on a mode-locked semiconductor laser, an external cavity arrangement includes a semiconductor laser element, a reflecting mirror optically coupled with the semiconductor laser via a collimating lens, and a wavelength selecting element and an etalon formed between the semiconductor laser element and reflecting mirror, the facet of the semiconductor laser element and the reflecting mirror form a main resonator, the etalon functions as a sub resonator having a resonator length that is an integral fraction of that of the main resonator, and a round-trip frequency that is an integral multiple of that of an optical clock pulse train determined by the main resonator is generated (see, e.g., Japanese Patent Laid-Open No. 2003-31897, pp. 3-6, FIGS. 1 to 3).

DISCLOSURE OF INVENTION

Problems to be Solved by the Invention

Unfortunately, the conventional techniques as described above have the problem that they cannot implement a mode-locked laser superior in size, cost, or yield.

For example, the technique disclosed in Japanese Patent Laid-Open No. 11-298072 uses the fiber resonator configuration, and this increases the number of parts, the size, and the cost. Also, a bulk element is used as the wavelength selecting element. More specifically, the central wavelength (optical frequency) is controlled by the gain bandwidth of a rare earth element (erbium Er for a 1.5-µm band, praseodymium Pr or neodymium Nd for a 1.3-µm band, or thulium Tm for a 1.4-µm band or 1.6-µm band) of a rare earth doped fiber as an amplification medium. Therefore, no precise central wavelength control can be performed.

On the other hand, the technique disclosed in Japanese Patent Laid-Open No. 2003-31897 uses the resonator configuration based on a spatial coupling, and this increases the size, the number of parts, and the packaging assembly cost. Also, a distributed Bragg reflector integrated in the semiconductor laser element is used as the wavelength selecting element. Since the distributed Bragg reflector has a complicated structure and requires microprocessing, problems arise in yield and cost. In addition, when an etalon is used as the sub resonator and a dispersion element such as a prism or diffraction grating or a bulk element such as a dielectric multilayered film filter is used as the wavelength selecting element, a lens for collimation is necessary, the number of parts increases, and a mechanical scheme is also required. This often increases the size and cost.

The present invention has been made to solve these problems, and has as its exemplary object to provide a small-sized, low-cost, mode-locked laser for generating a high-quality optical clock pulse train at a high repetition frequency. It is another exemplary object of the present invention to provide a mode-locked laser capable of adjustment if a wavelength selecting function and repetition frequency multiplying function deviate from the design.

Means for Solving the Problems

To achieve the above exemplary objects, a mode-locked laser according to the present invention includes a two-electrode semiconductor laser including a saturable absorber section and a gain section, and a resonator optical waveguide formed outside the gain section of the two-electrode semiconductor laser, wherein the resonator optical waveguide includes a first ring resonator and a second ring resonator connected in series with the two-electrode semiconductor laser, and a reflective surface which reflects, toward the two-electrode semiconductor laser, a laser beam having arrived from the two-electrode semiconductor laser via the first ring resonator and the second ring resonator, the first ring resonator has a resonator length which is an integral fraction of a total resonator length of the mode-locked laser, and the second ring resonator has bandpass filter characteristics whose bandwidth is narrower than a gain bandwidth of the two-electrode semiconductor laser.

Effects of the Invention

The present invention can decrease the length of the gain section of the two-electrode semiconductor laser, and suppress the timing jitter and the relative intensity noise (RIN). The present invention can also multiply the repetition frequency of an optical pulse train by a desired integral value by selecting the integral ratio of the length of the ring resonator to the external cavity length, thereby readily adjusting the setting of a high repetition frequency. In addition, these functions can be achieved by combining the two-electrode semiconductor laser and the external cavity including the optical waveguide formable by the known semiconductor manufacturing technique. This makes it possible to provide a small-sized, low-cost, mode-locked laser. Especially when using an SiON optical waveguide or Si-wire optical waveguide in which the core and cladding have a high refractive index difference, it is possible to decrease the bending loss and further downsize the laser.

BEST MODE FOR CARRYING OUT THE INVENTION

Exemplary embodiments of the present invention will be explained below with reference to the accompanying drawings.

First Exemplary Embodiment

Figure 1:
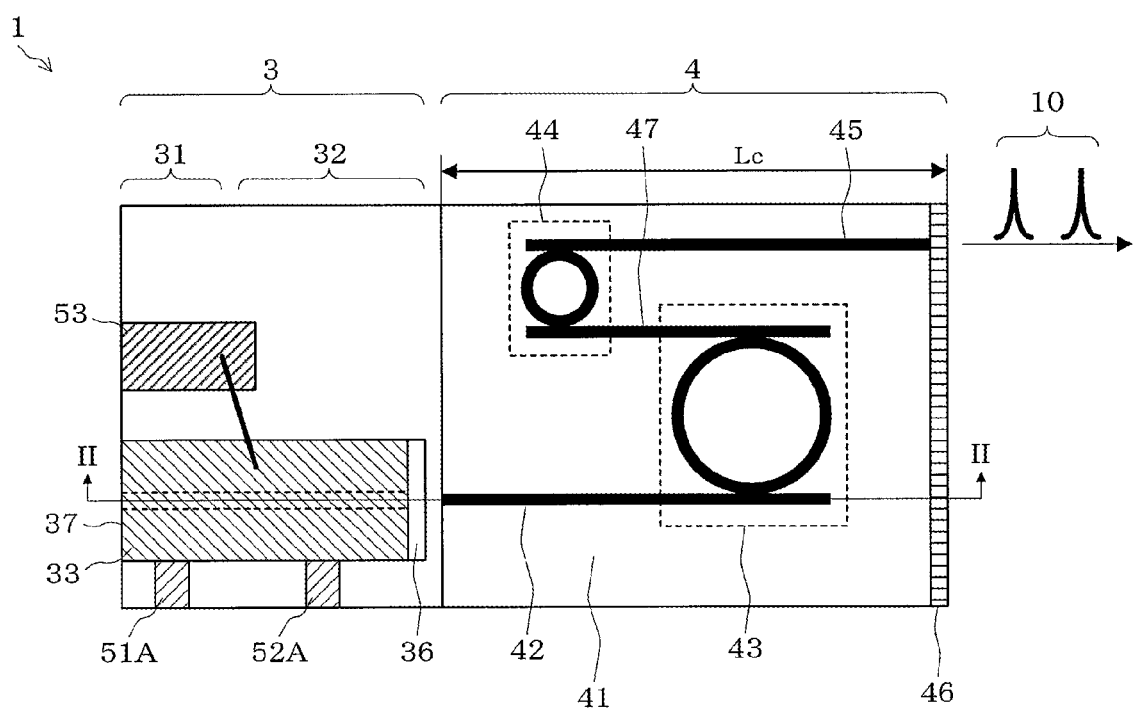
FIG. 1 is a plan view showing the arrangement of a mode-locked laser according to the first exemplary embodiment of the present invention.
Figure 2:
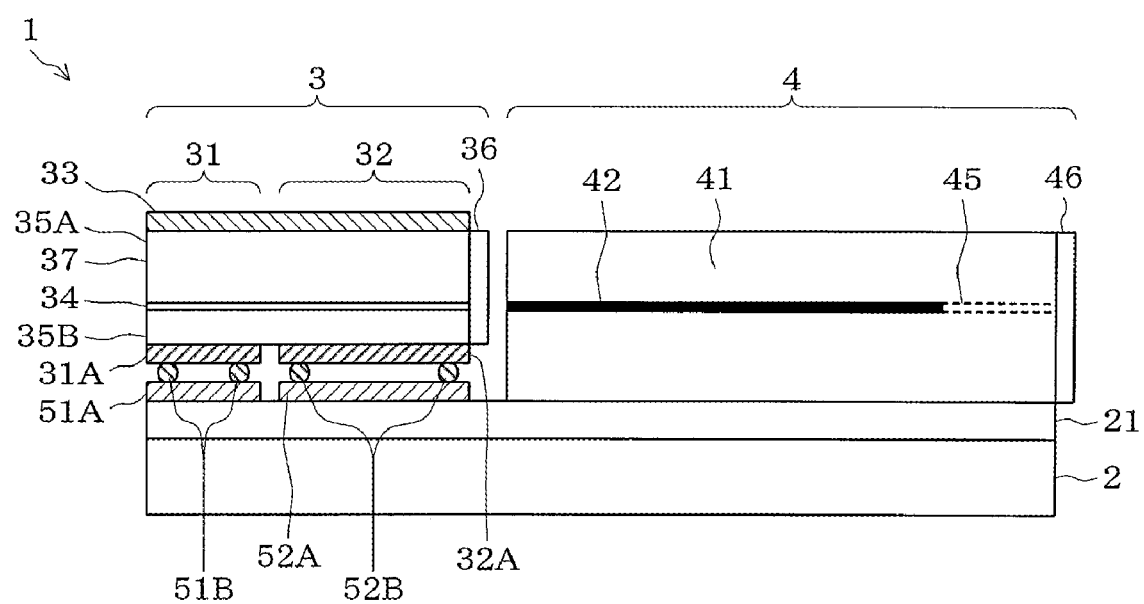
FIG. 2 is a sectional view taken along a line II-II in FIG. 1.

First, a mode-locked laser according to the first exemplary embodiment of the present invention will be explained below with reference to FIGS. 1 and 2.

This mode-locked laser mainly includes a substrate 2, an insulating layer 21 formed on the substrate 2, and a two-electrode semiconductor laser 3 and optical waveguide 4 (a resonator optical waveguide) formed on the insulating layer 21, and is formed by the known semiconductor manufacturing technique.

The two-electrode semiconductor laser 3 includes an active layer 34 in which a saturable absorber section 31 and gain section 32 are formed, a first cladding layer (n-type) 35A formed above the active layer 34, a backside electrode (n-side electrode) 33 formed on the upper surface of the first cladding layer 35A, a second cladding layer (p-type) 35B formed below the active layer 34, electrodes 31A and 32A (p-side electrodes) formed on the lower surface of the second cladding layer 35B, and an antireflection coating (AR coating) 36 formed on the outer side surface of the active layer 34 on the side of the gain section 32.

To separately form the electrodes 31A and 32A, the two-electrode semiconductor laser 3 is generally formed as an independent chip in order from the side of the backside electrode 33, and mounted on the substrate 2 after being turned over. Also, the substrate 2 has a ground electrode 53 in a position juxtaposed with the two-electrode semiconductor laser 3. The ground electrode 53 is electrically connected to the backside electrode 33 via a jumper.

An electrode 51A is formed on the insulating layer 21 so as to face the electrode 31A, and electrically connected to the electrode 31A via bumps 51B. The negative electrode of a constant-voltage source (not shown) is connected to the electrode 51A, and a reverse bias voltage is applied to the electrode 31A via the electrode 51A and bumps 51B, thereby forming the saturable absorber section 31.

Also, an electrode 52A is formed on the insulating layer 21 so as to face the electrode 32A, and electrically connected to the electrode 32A via bumps 52B. The positive electrode of a constant-current source (not shown) is connected to the electrode 52A, and a constant current is injected into the electrode 32A via the electrode 52A and bumps 52B, thereby forming the gain section 32. Note that the opposite polarity type of the semiconductor laser may also be used.

The antireflection coating 36 has a function of suppressing unnecessary reflection against a laser beam going and returning through the two-electrode semiconductor laser 3 and optical waveguide 4.

A reflective surface 37 on the opposite side of the two-electrode semiconductor laser 3 has a reflectance of about 30% for cleavage based on the crystal structure. However, a high-reflection coating (HR coating) may also be formed.

The optical waveguide 4 is formed by stacking a cladding layer 41 and a core layer consisting of core 42, ring resonator 43, core 47, ring resonator 44, and core 45 on the substrate 2, and reaches the facet from the side of the two-electrode semiconductor laser 3 via the core 42, ring resonators 43 and 44, and core 45. A reflective surface 46 made of an HR coating is formed on the facet. The ring resonator 43 has a function of determining the pulse period of a desired optical pulse train 10. The ring resonator 44 has a function of determining the central frequency and the bandwidth, (i.e., the pulse width), of the spectral band of the optical pulse train 10.

Each of the ring resonators 43 and 44 includes a general ring optical waveguide. On the outer circumference of this ring optical waveguide, linear input/output waveguides are arranged in positions opposite to each other around the center of the ring optical waveguide so as to form slight gaps with the ring optical waveguide, thereby forming a directional coupler. It is also possible to form a 2×2 multimode interferometer by a multimode waveguide wider than the width of the two waveguides instead of the directional couplers. In this exemplary embodiment, one input/output waveguide of the ring resonator 43 and one input/output waveguide of the ring resonator 44 are connected in series by the core 47. The other input/output waveguide of the ring resonator 43 is connected to the two-electrode semiconductor laser 3 by the core 42. The other input/output waveguide of the ring resonator 44 is connected to the reflective surface 46 by the core 45.

Accordingly, the resonator of the whole of a mode-locked laser 1 includes the reflective surface 37 of the two-electrode semiconductor laser 3, the reflective surface 46 of the optical waveguide 4, and the active layer 34 of the two-electrode semiconductor laser 3 and the core 41, ring resonator 43, core 47, ring resonator 44, and core 45 of the optical waveguide 4 that connect the reflective surfaces 37 and 46.

Letting Lt (Lt is the optical length) be the resonator length (total resonator length) of the whole of the mode-locked laser 1 and neff be the effective refractive index of the waveguide, a round-trip length Lr1 of the ring resonator 43, which is equivalent to the actual waveguide length is represented by $$neff \cdot Lr1 = Lt/m \text{ (}m \text{ is a positive integer)} \tag{1}$$

On the other hand, a round-trip length Lr2 of the ring resonator 44 is at least ½ or less, and desirably, 1/10 or less the round-trip length Lr1 of the ring resonator 43. Letting ndeff be the effective refractive index of the two-electrode semiconductor laser 3, Ld be the physical length of the two-electrode semiconductor laser 3, ngeff be the effective refractive index of the gap between the two-electrode semiconductor laser 3 and optical waveguide 4, Lg be the physical length of the gap, Lc be the total length of the input/output waveguides of the ring resonators connected to the cores 42, 47, and 45, and Lr2 be the round-trip length of the ring resonator 44, the resonator length Lt is represented by $$Lt = ndeff \cdot Ld + ngeff \cdot Lg + neff \cdot \left(Lc + Lr\frac{1}{2} + Lr\frac{2}{2}\right) \tag{2}$$

which indicates the optical length from the reflective surface 37 to the reflective surface 46.

Accordingly, an optical pulse train having a repetition frequency of 100 GHz is generated when the physical length of the two-electrode semiconductor laser 3 is Ld=0.5 mm, the length of the saturable absorber section 31 is 0.05 mm, the resonator length is Lt=15 mm, the round-trip length of the ring resonator 43 is Lr1=1 mm, and that of the ring resonator 44 is Lr2=0.3 mm.

Operation of First Exemplary Embodiment

The operation of the mode-locked laser according to the first exemplary embodiment of the present invention will be explained below with reference to FIGS. 3 to 6.

Figure 4:
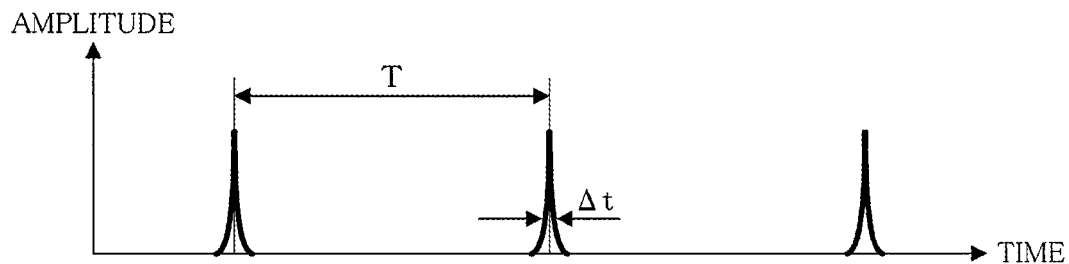
FIG. 4 is a graph showing an optical pulse train output from the mode-locked laser (without a second ring resonator)

As shown in FIG. 4, when an electric current is injected from the constant-current source (not shown) to the gain section 32 of the two-electrode semiconductor laser 3 via the electrode 52A, bumps 52B, and electrode 32A and a reverse vias voltage is applied from the constant-voltage source 51 to the saturable absorber section 31 via the electrode 51A, bumps 51B, and electrode 31A, the optical pulse train 10 having period T=2Lt/c (c is the velocity of light in a vacuum) with respect to the resonator length Lt is generated.

If there is no ring resonator 43, a longitudinal mode range Δf of the mode-locked laser 1 is Δf=1/T, i.e., equal to the repetition frequency.

Figure 3:
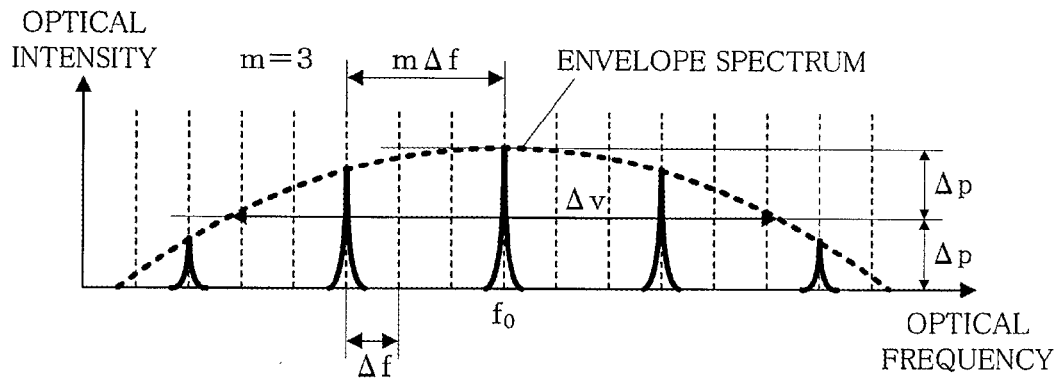
FIG. 3 is a graph showing the optical spectrum of the optical output from the mode-locked laser.
Figure 5:
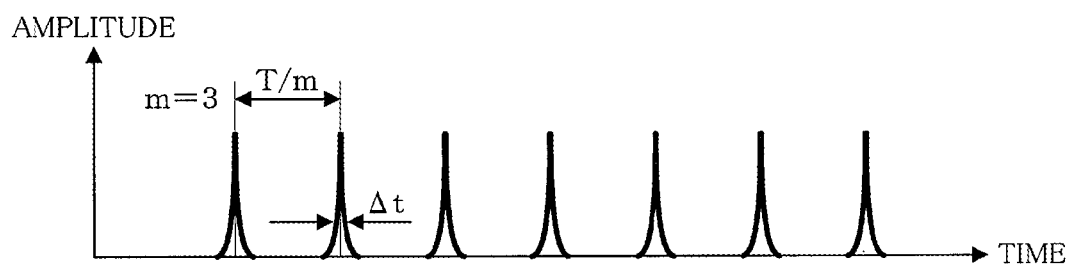
FIG. 5 is a graph showing an optical pulse train output from the mode-locked laser (with a second ring resonator)

On the other hand, when the ring resonator 43 is installed, the longitudinal mode range of the mode-locked laser 1 is determined by the free spectral range (FSR) of the ring resonator 43. Therefore, an m-fold frequency range m·Δf of each longitudinal mode is selected as shown in FIG. 3, and the optical pulse train 10 as shown in FIG. 5 is generated. The period is represented by $$1/(m \cdot \Delta f) = T/m \quad (3)$$

Figure 6:
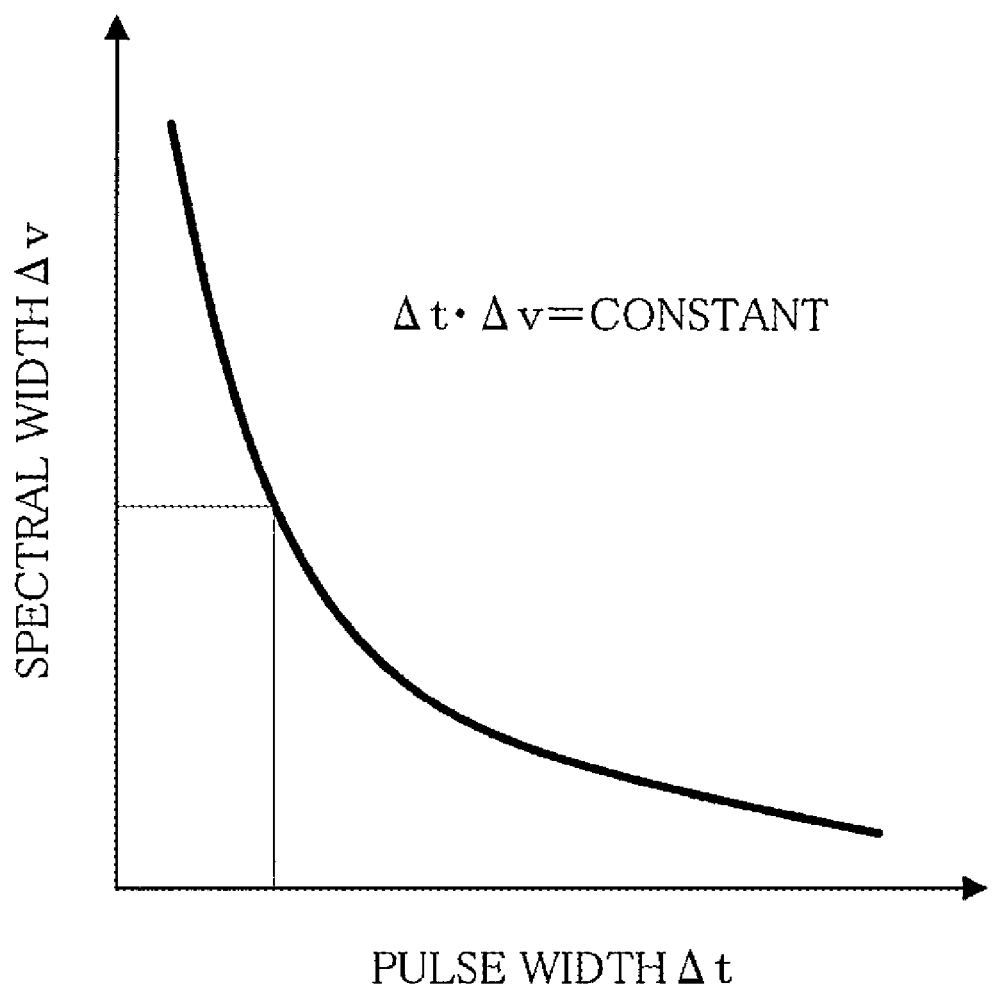
FIG. 6 is a graph showing the relationship when the product of the time and bandwidth is constant.

A pulse width Δt is determined by a half-width Δp of the envelope amplitude of a plurality of longitudinal modes determined by the gain. The pulse width Δt is adjusted by the filter characteristics of the ring resonator 44 narrower than the gain bandwidth. That is, as shown in FIG. 6, the adjustment can be performed by using a filter bandwidth Δν near the gain wavelength of the two-electrode semiconductor laser 3, e.g., Δt can be decreased by increasing Δν by using a relationship of "time-bandwidth product Δt·Δν=constant" based on the quantization limit.

In particular, the size of the ring resonator 44 is smaller than that of the ring resonator 43. Accordingly, a waveguide using SiON as a core and $SiO_2$ as a cladding or a waveguide having a high refractive index difference such as an Si-wire waveguide can decrease the bending loss, when compared to a waveguide made of silica glass or the like and having a low refractive index difference (about 1%).

Effects of First Exemplary Embodiment

In this exemplary embodiment as described above, the mode-locked laser includes the two-electrode semiconductor laser 3 including the saturable absorber section 31 and gain section 32, and the optical waveguide 4 formed outside the gain section 32 of the two-electrode semiconductor laser. The optical waveguide 4 includes the first ring resonator 43 having the resonator length that is an integral multiple of the total resonator length, the second ring resonator 44 having the band-pass filter characteristics whose bandwidth is narrower than the gain bandwidth, and the reflective surface 46 that reflects, toward the two-electrode semiconductor laser 3, a laser beam having arrived from the two-electrode semiconductor laser 3 via the first and second ring resonators.

This makes it possible to decrease the length of the gain section of the two-electrode semiconductor laser, and suppress the timing jitter and RIN. It is also possible to multiply the repetition frequency of an optical pulse train by a desired integral value by selecting the integral ratio of the length of the ring resonator to the total resonator length. This facilitates adjusting the setting of a high repetition frequency. In addition, these functions can be achieved by a combination of the two-electrode semiconductor laser and the resonator including the optical waveguide formable by the known semiconductor manufacturing technique. Accordingly, a small-sized, low-cost, mode-locked laser can be provided. Especially when using an SiON optical waveguide or Si-wire optical waveguide in which the core and cladding have a high refractive index difference, it is possible to decrease the bending loss and further downsize the laser.

Second Exemplary Embodiment

Figure 7:
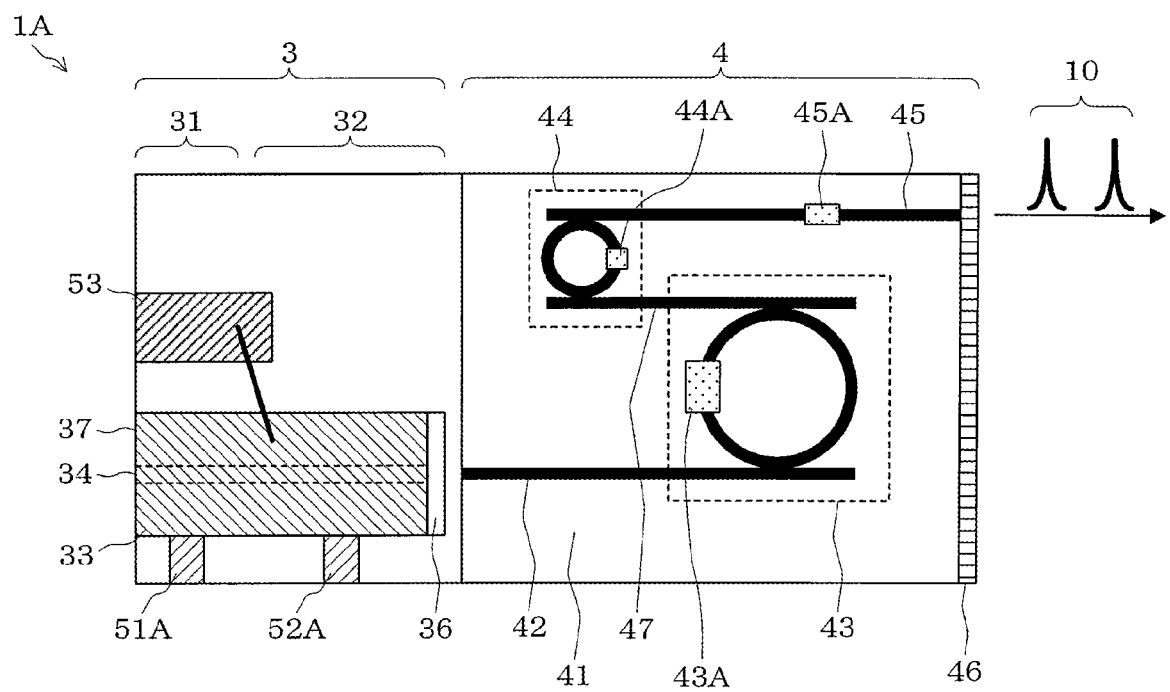
FIG. 7 is a plan view showing the arrangement of a mode-locked laser according to the second exemplary embodiment of the present invention.

A mode-locked laser according to the second exemplary embodiment of the present invention will be explained below with reference to FIG. 7.

This exemplary embodiment differs from the first exemplary embodiment in that a ring resonator 43, ring resonator 44, and core 45 of an optical waveguide 4 are respectively equipped with adjusting electrodes 43A, 44A, and 45A. Note that the rest of the arrangement is the same as that of the first exemplary embodiment, and a repetitive explanation will be omitted.

When electric currents are supplied to the adjusting electrodes 43A, 44A, and 45A, the thermo-optic effect occurs in portions of optical waveguides forming the ring resonators 43 and 44, and the refractive indices change. Consequently, the round-trip lengths of the ring resonators 43 and 44 apparently change.

When changing an effective refractive index neff of above-mentioned equation (1) by controlling the adjusting electrode 43A, the deviation of the multiplying function of the ring resonator can be adjusted by an optical length neff·Lr1 even if a physical round-trip length Lr1 deviates from the design owing to the accuracy deviation of the process.

Also, when changing the effective refractive index neff of above-mentioned equation (1) by controlling the adjusting electrode 44A, the filter characteristics of the ring resonator 44 change, and a spectral width Δν shown in FIG. 3 described previously changes. As a consequence, a central optical frequency $f_0$ (the central wavelength) near the gain bandwidth of the filter characteristics changes.

Furthermore, when changing the effective refractive index neff of above-mentioned equation (1) by controlling the adjusting electrode 45A, a total resonator length Lt (the optical length) changes. Accordingly, even if the physical waveguide length deviates from the design owing to the accuracy deviation of the process, the deviations of a period T and repetition frequency Δf can be adjusted by the total resonator length Lt.

Note that an adjusting electrode like the adjusting electrode 45A may also be formed in a part of the optical waveguide 4, such as a core 42 or 47, except for the ring resonators 43 and 44, and given the same function as that of the adjusting electrode 45A.

Effects of Second Exemplary Embodiment

As described above, this exemplary embodiment can readily adjust the deviation of the multiplying function of the ring resonator 43 of the optical waveguide 4 because the ring resonator 43 is equipped with the adjusting electrode 43A. Also, since the ring resonator 44 is equipped with the adjusting electrode 44A, the spectral width or central optical frequency of the filter characteristics can easily be adjusted even after the mode-locked laser is manufactured. Furthermore, since the core 45 is equipped with the adjusting electrode 45A, it is readily possible to adjust the deviations of the period T and repetition frequency Δf of an optical pulse train even after the mode-locked laser is manufactured. Accordingly, the multiplying function of the ring resonator, the spectral width and central optical frequency of the filter characteristics, and the repetition frequency of an optical pulse train can be adjusted and set within allowable ranges. This makes it possible to greatly improve the yield and cost reduction.

Third Exemplary Embodiment

A mode-locked laser according to the third exemplary embodiment of the present invention will be explained below with reference to FIGS. 8 to 11.

Figure 8:
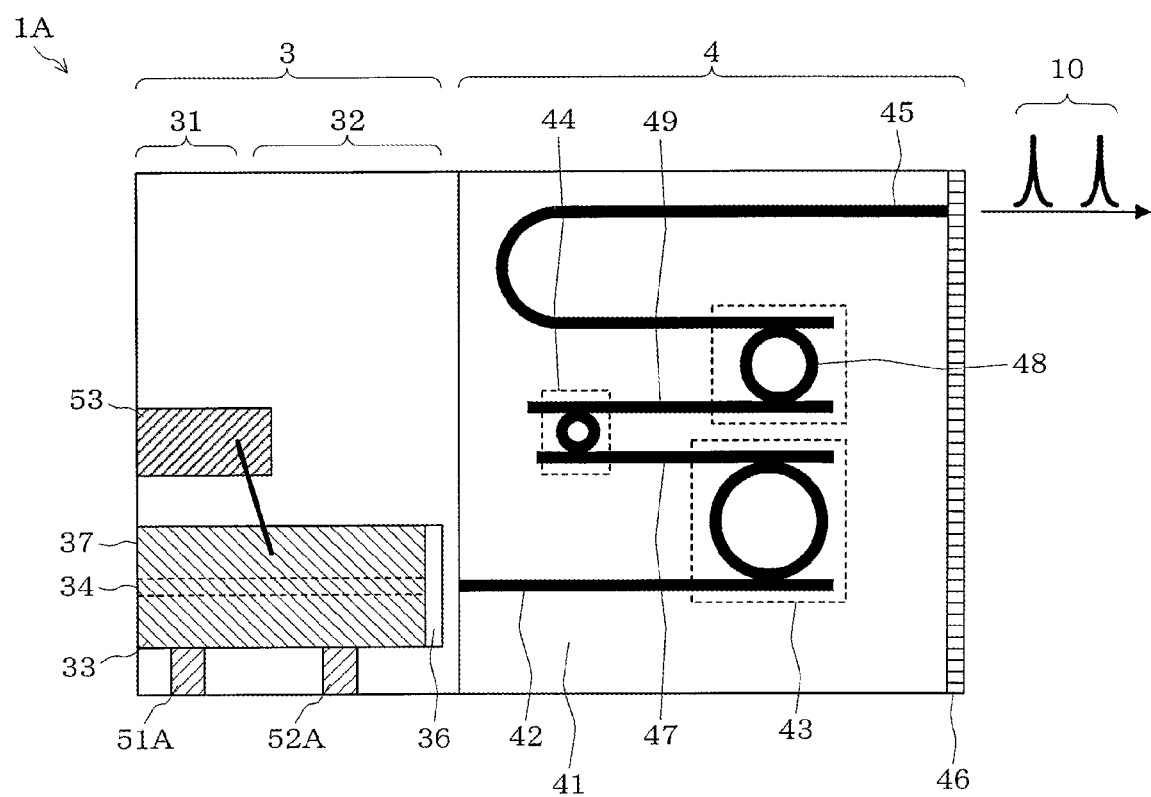
FIG. 8 is a plan view showing the arrangement of a mode-locked laser according to the third exemplary embodiment of the present invention.

As shown in FIG. 8, a mode-locked laser 1B of this exemplary embodiment differs from the first or second exemplary embodiment in that a ring resonator 48 (a third ring resonator) is formed between a ring resonator 44 and core 45, the other input/output waveguide of the ring resonator 44 and one input/output waveguide of the ring resonator 48 are connected by a core 49, and the core 45 is connected to the other input/output waveguide of the ring resonator 48. Similar to equation (1) described earlier, a round-trip length Lr1 of a ring resonator 43 and a round-trip length Lr3 of the ring resonator 48 are represented by $$neff \cdot Lr1 = Lt/m \quad (4)$$

$$neff \cdot Lr3 = Lt/n \quad (5)$$

where Lt is the resonator length, n is a positive integer, and m≠n. Note that the rest of the arrangement is the same as that of the first or second exemplary embodiment, and a repetitive explanation will be omitted.

Figure 9:
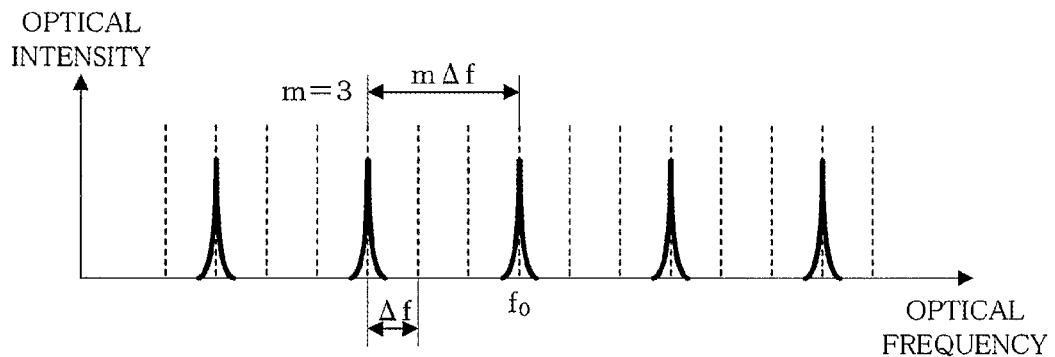
FIG. 9 is a graph showing the light transmitting characteristic of a first ring resonator.
Figure 10:
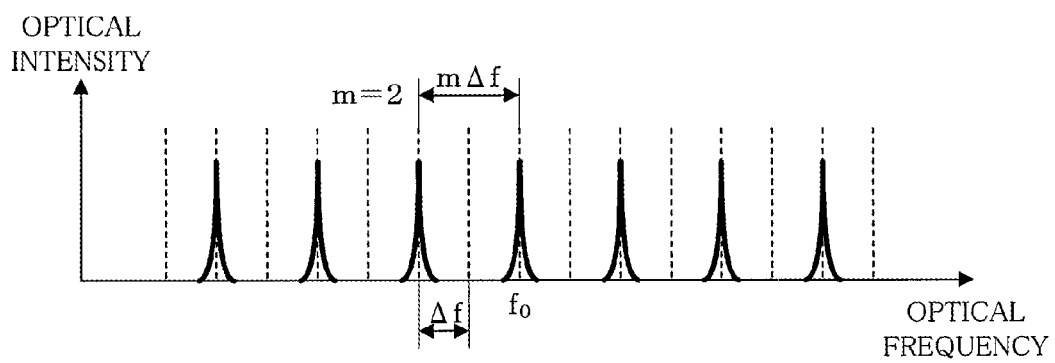
FIG. 10 is a graph showing the light transmitting characteristic of a third ring resonator.
Figure 11:
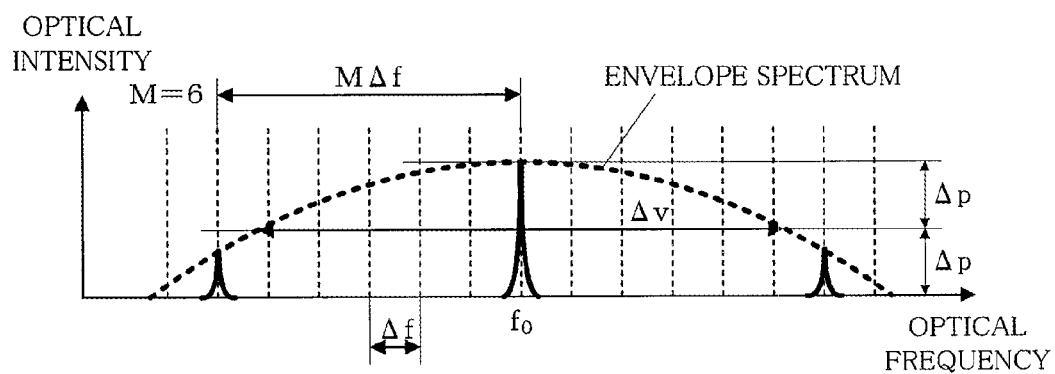
FIG. 11 is a graph showing the optical spectrum of the optical output from the mode-locked laser according to the third exemplary embodiment of the present invention.

When m=3 and n=2 in this exemplary embodiment, for example, a longitudinal mode range 61 of the ring resonator 43 is three times a longitudinal mode range Δf of all the resonators of the mode-locked laser 1B as shown in FIG. 9, and the longitudinal mode range of the ring resonator 48 is twice the longitudinal mode range Δf of all the resonators as shown in FIG. 10. Since the ring resonators 43 and 48 are connected in series, therefore, transmitting characteristics are obtained at only an optical frequency at which these longitudinal modes are overlapped. Consequently, as shown in FIG. 11, it is possible to obtain optical spectral characteristics having a longitudinal mode range M·Δf obtained by multiplying the longitudinal mode range Δf of all the resonators by M as the least common multiple of m and n.

Effects of Third Exemplary Embodiment

As described above, an optical pulse train 10 having a spectrum whose frequency range is M·Δf (where M is the least common multiple of m and n) can be generated by setting each of the round-trip lengths Lr1 and Lr3 of the ring resonators 43 and 48 to an integral multiple of the resonator length Lt.

Accordingly, although the operation often becomes unstable in the first exemplary embodiment when m increases, the third exemplary embodiment can achieve a highly repetitive operation multiplied by M larger than m and n. This means that a highly repetitive operation can be achieved by m and n smaller than M. Consequently, the process margin of each ring resonator can be widened.

INDUSTRIAL APPLICABILITY

Application examples of the present invention are optical communication represented by, e.g., an inter-city network and intercontinental/intracontinental large-capacity transmission, and an optical interconnection applied to, e.g., a server/router.

The invention claimed is:

1. A mode-locked laser comprising a semiconductor laser including a saturable absorber section and a gain section, and a resonator optical waveguide formed outside the gain section of said semiconductor laser, wherein
    said resonator optical waveguide includes a first ring resonator and a second ring resonator connected in series with said semiconductor laser,
    said first ring resonator has a resonator length which is an integral fraction of a total resonator length of the mode-locked laser, and
    said second ring resonator has bandpass filter characteristics whose bandwidth is narrower than a gain bandwidth of said semiconductor laser.

2. A mode-locked laser according to claim 1, wherein said resonator optical waveguide includes a reflective surface which reflects, toward said semiconductor laser, a laser beam having arrived from said semiconductor laser via said first ring resonator and said second ring resonator.

3. A mode-locked laser according to claim 1, wherein said first ring resonator and second ring resonator of said resonator optical waveguide each comprise an optical waveguide including a cladding layer formed on a substrate outside the gain section, and a core layer in said cladding layer.

4. A mode-locked laser according to claim 3, wherein said resonator optical waveguide comprises an adjusting electrode which adjusts a refractive index of a part of said optical waveguide forming said first ring resonator.

5. A mode-locked laser according to claim 3, wherein said resonator optical waveguide comprises an adjusting electrode which adjusts a refractive index of a part of said optical waveguide forming said second ring resonator.

6. A mode-locked laser according to claim 3, wherein said resonator optical waveguide comprises an adjusting electrode which adjusts a refractive index of a part of an optical waveguide except for said first ring resonator and said second ring resonator.

7. A mode-locked laser according to claim 1, wherein the saturable absorber section and gain section of said semiconductor laser each comprise a semiconductor waveguide including an active layer formed on a substrate, and electrodes formed above and below said semiconductor waveguide.

8. A mode-locked laser according to claim 1, wherein said semiconductor laser comprises two electrodes including a saturable absorber section and a gain section.

9. A mode-locked laser according to claim 1, wherein
    said resonator optical waveguide comprises a third ring resonator in addition to said first ring resonator and said second ring resonator,
    said first ring resonator has a resonator length which is 1/m (m is a positive integer) the total resonator length, and
    said third ring resonator has a resonator length which is 1/n (n is a positive integer and m≠n) the total resonator length.

* * * * *